United States Patent
Petrosky

(10) Patent No.: US 6,535,067 B1
(45) Date of Patent: Mar. 18, 2003

(54) POWER SATURATION CONTROL OF CLASS C BIPOLAR AMPLIFIERS

(75) Inventor: Kenneth J. Petrosky, Severna Park, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/952,400

(22) Filed: Sep. 14, 2001

(51) Int. Cl.[7] .................................................. H03G 3/10
(52) U.S. Cl. ........................................ 330/285; 330/296
(58) Field of Search ................................ 330/285, 296, 330/302, 307, 300

(56) References Cited

U.S. PATENT DOCUMENTS

| 3,486,128 A | * 12/1969 | Lohrmann | 330/285 |
| 4,644,293 A | * 2/1987 | Kennett | 330/130 |
| 4,839,612 A | * 6/1989 | Akagi | 330/296 |
| 4,890,070 A | * 12/1989 | Benahim et al. | 330/296 |
| 5,281,925 A | * 1/1994 | Hulick | 327/170 |
| 5,966,051 A | * 10/1999 | Griffith et al. | 330/145 |

* cited by examiner

Primary Examiner—Tuan T. Lam
(74) Attorney, Agent, or Firm—Birch, Stewart, Kolasch & Birch, LLP

(57) ABSTRACT

A Class C bipolar transistor amplifier including circuit means having a non-linear, high-current, low-knee voltage transfer characteristic in series with the emitter RF choke of a common base bipolar transistor, which increases the emitter bias voltage, and in turn forces the amplifier deeper into Class C operation during overdrive, effectively limiting the output power. In one embodiment, a low ohmic resistor and a MOSFET device are connected in series with the emitter RF choke of a common base bipolar transistor Class C amplifier. An active feedback control loop implemented with conventional operational amplifier (OP AMP) circuitry controls the MOSFET device so as to operate in the knee region of its current-voltage characteristic during power overdrive. In a second embodiment, a single non-linear circuit element such as a constant current diode having a high-current, low-knee voltage transfer characteristic is connected in series with the emitter RF choke. The constant current diode consists of a depletion mode MOSFET or JFET having the gate directly connected to the drain.

16 Claims, 3 Drawing Sheets

POWER SATURATION CONTROL OF CLASS C BIPOLAR AMPLIFIERS

BACKGROUND OF THE INVENTION

1. Field of the Invention

This invention relates generally to semiconductor power amplifiers and more particularly to Class C bipolar transistor amplifiers having limited output power under overdrive conditions.

2. Description of Related Art

Class C bipolar transistor amplifiers are generally well known and have been widely used in solid state transmitters, particularly transmitters used in connection with radar systems. Along with improvements being made in such apparatus, improvements have also been made in bipolar power transistor technology, such as with the introduction of polysilicon emitters and silicon germanium (SiGe) bases to extend their performance limits. Such improvements have resulted in increasing the power and frequency limits of these devices. However, in doing so, some of the unwanted parasitics which hinder power performance have been removed, thus expanding the limit of maximum power which can be generated. Nevertheless, a new requirement has been presented to transistor designers, that being the fabrication of transistors that saturate at a particular power output level. A second added requirement has been to pass a voltage standing wave ratio (VSWR) survival test during an overdrive condition. These requirements have resulted in a significant amount of failed parts and a considerable increase in cost due to poor RF test yield.

SUMMARY

Accordingly, it is the primary object of the present invention to provide power saturation control of Class C bipolar amplifiers.

This is achieved by connecting circuit means having a non-linear current voltage characteristic in series with the emitter RF choke of a common base bipolar transistor, which in turn increases the emitter bias voltage, and in turn forces the amplifier deeper into Class C operation. In a first aspect of the invention, a low ohmic resistor and a MOSFET device are connected in series with the emitter RF choke of a common base bipolar transistor Class C amplifier. An active feedback control loop implemented with conventional operational amplifier (OP AMP) circuitry controls the MOSFET device so as to operate in the knee region of its current-voltage characteristic during power overdrive to reduce the gain of the amplifier and thus maintain the power output substantially constant. In a second aspect of the invention, a non-linear circuit element connected in series with the emitter RF choke exhibits a low voltage drop if the supply current, resulting from a particular input signal, is below some critical level. At input levels forcing the current above the critical level, a rapid increase in emitter voltage occurs, limiting the gain by adjusting the conduction angle, effectively causing power saturation. A constant current diode having a high current, low knee voltage characteristic would provide such a non-linear characteristic and would be comprised of, for example, a depletion mode MOSFET or JFET where the gate is directly connected to the drain.

Further scope of applicability of the present invention will become apparent from the detailed description provided hereinafter. It should be understood, however, that the detailed description and specific examples, while disclosing the preferred embodiments of the invention, it is provided by way of illustration only, thus various changes and modifications coming within the spirit and scope of the invention will become apparent to those skilled in the art from the detailed description.

BRIEF DESCRIPTION OF THE DRAWINGS

The following detailed description of the invention will become more fully understood when considered in connection with the accompanying drawings which are provided by way of illustration only, and thus are not meant to be considered in a limiting sense, and wherein.

DETAILED DESCRIPTION OF THE INVENTION

Conventional power control loops around Class C transistor amplifiers can be cumbersome, and in the case of controlling gain with a collector voltage adjustment, can risk shifting the transistor internal tuning or making it more susceptible to spurious oscillations. The present invention is directed to the concept of providing power saturation control of a Class C common base bipolar transistor amplifier by altering the amount of external impedance in series with the emitter RF choke, which in turn increases the emitter bias voltage, forcing the amplifier deeper into Class C operation, resulting in gain reduction. In its implementation, the subject invention involves connecting circuit means having a non-linear current-voltage transfer characteristic in series with an RF choke coil connected to the emitter so as to produce a bias change.

Figure 1:
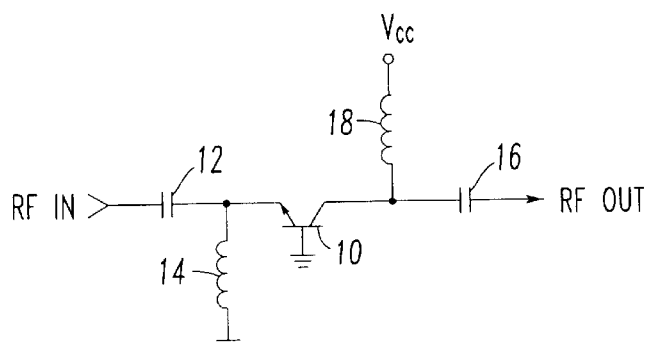
FIG. 1 is a simple schematic diagram generally illustrative of a conventional Class C bipolar transistor amplifier without RF matching circuitry in the RF path.

Referring now to the drawings where like reference numerals refer to like components throughout, reference is first made to FIG. 1. Disclosed thereat is a standard Class C bipolar transistor amplifier simplified by the exclusion of RF matching circuitry in the RF path. As shown, reference numeral 10 denotes a grounded base n-p-n bipolar transistor whose emitter electrode is connected to an RF input signal via a coupling capacitor 12. An inductor element 14 which serves as an RF choke is connected to the emitter electrode and is returned to a point of reference potential shown as ground. The collector electrode of the bipolar transistor 10 outputs an RF output signal via a coupling capacitor 16. A collector bias potential $V_{CC}$ is applied to the collector electrode by means of a second RF choke 18.

Figure 2:
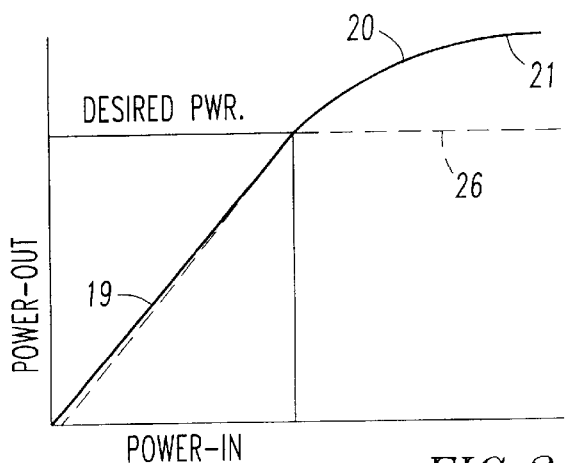
FIG. 2 is a graphical representation of power transfer functions helpful in understanding the operation of the subject invention.

A typical power transfer function for the circuit shown in FIG. 1 is shown by a solid line curve 20 of FIG. 2, having a generally linear portion 19 at lower power levels but then becomes non-linear as it proceeds into an upper level of power saturation 21.

Figure 3:
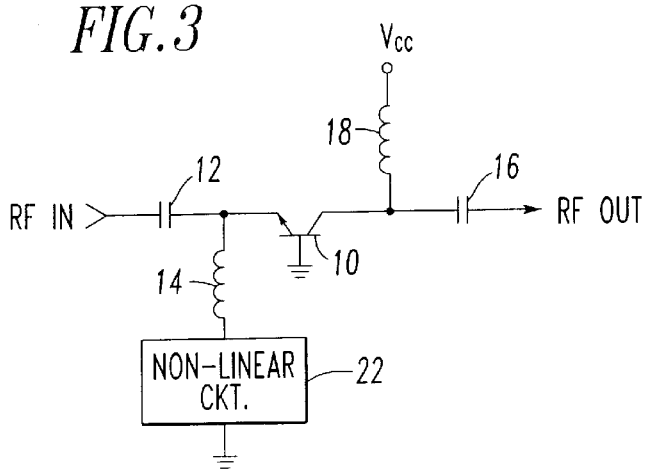
FIG. 3 is a simplified schematic diagram illustrative of a Class C bipolar transistor amplifier in accordance with the subject invention.
Figure 4:
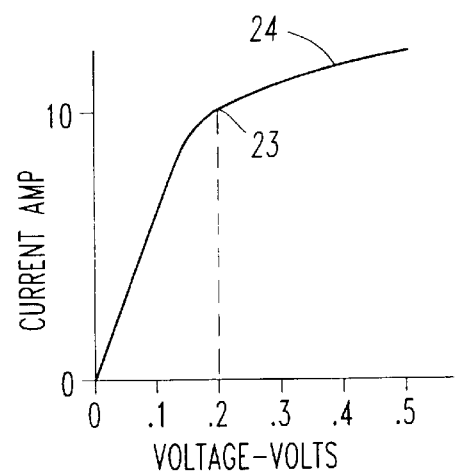
FIG. 4 is a graph illustrative of the requisite non-linear current-voltage transfer characteristic of the non-linear circuit means connected to the emitter choke of the Class C amplifier shown in FIG. 3.

The subject invention in its basic form is shown in FIG. 3 and comprise the inclusion of circuit means 22 having a non-linear current-voltage transfer characteristic, in series with the emitter choke inductor 14. Such a characteristic is shown in FIG. 4 and comprises one wherein a relatively high current output results from a relatively small control voltage, for example, where an output of approximately 10 amperes results from a voltage of 0.2 volts, and moreover, the operating point is set in the knee region 23 of the current voltage characteristic shown by reference numeral 24, with a resulting power transfer function being provided as shown by the dotted line 26 shown in FIG. 2, indicating that a desired power output level is substantially limited for any increase in input power.

It has been empirically determined that values of a series resistive impedance element less than 15 milli-ohms in the emitter circuit has little effect on the amplifier gain of a Class C common base bipolar amplifier such as shown in FIG. 3. Accordingly, the non-linear circuit element(s) of 22 must exhibit a series resistance of less than 15 milli-ohms until the critical current as shown by reference numeral 23 of FIG. 4 is reached. Thereafter, it then changes to a higher resistivity or constant current slope at that critical current.

Figure 5:
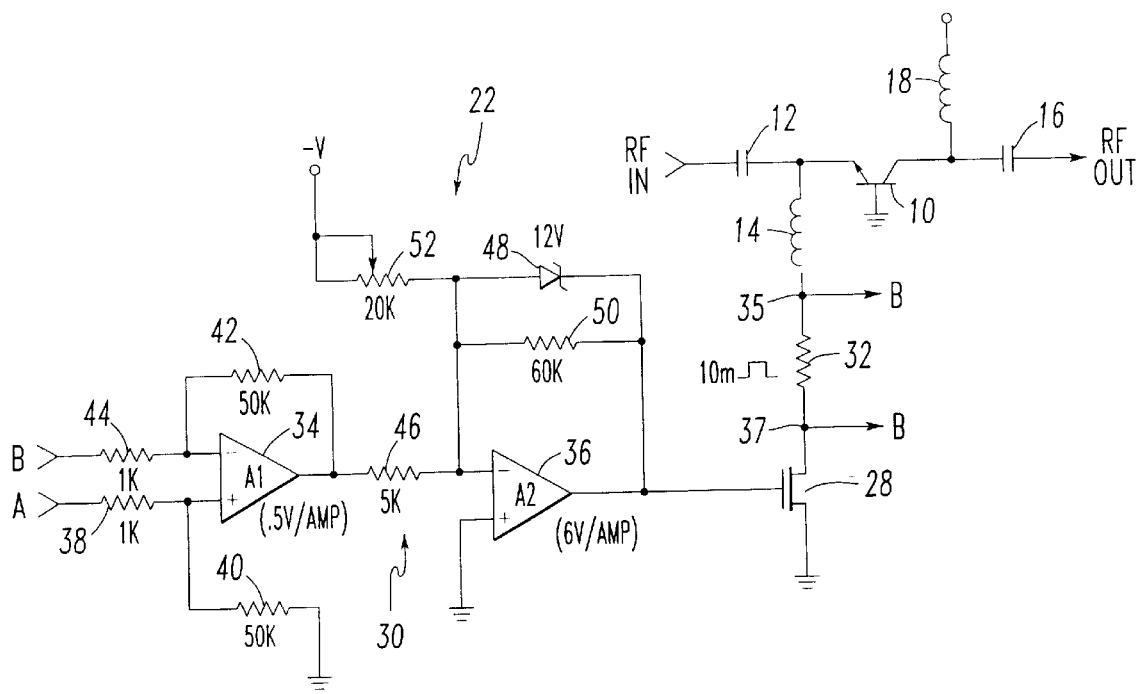
FIG. 5 is an electrical schematic diagram illustrative of an active circuit implementation of the invention shown in FIG. 3.
Figure 7:
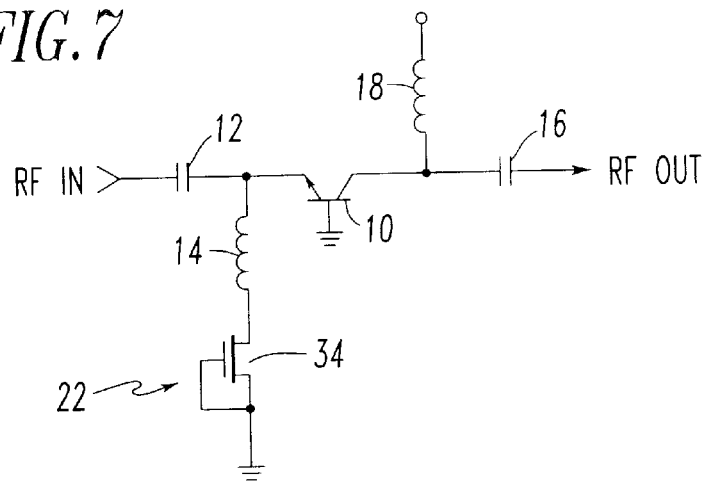
FIG. 7 is an electrical schematic diagram of a passive circuit implementation of the subject invention shown in FIG. 3.

Two embodiments for implementing this non-linear current voltage transfer characteristic is shown in FIGS. 5 and 7. The embodiment shown in FIG. 5 utilizes a MOSFET device 28 and an active feedback control loop 30 including a low ohmic (10 milli-ohms) series resistor 32. While such an implementation can be achieved with low cost components, there is an inherent disadvantage in that it requires a certain amount of "real estate" on a circuit board and there is a need for op-amp power supplies, not shown.

The second embodiment utilizes a passive depletion mode MOSFET or JFET connected in a constant current diode configuration as shown in FIG. 7 including MOSFET 34 having gate and drain electrodes, commonly connected together. The advantage of the circuit configuration of FIG. 7 is that only a single two terminal device is required and thus it would be an obvious design choice depending upon its availability.

Figure 6:
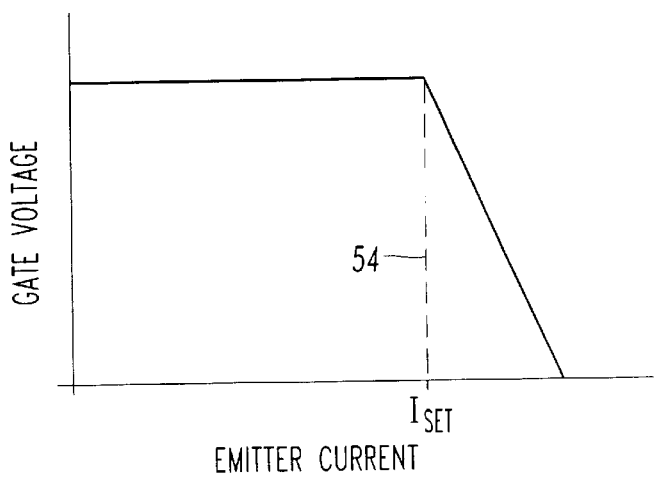
FIG. 6 is a characteristic curve depicting the desired control function for the MOS control transistor shown in FIG. 5.

The operational amplifier circuit configuration shown in FIG. 5 is designed to provide a feedback control function as shown in FIG. 6. The circuit shown in FIG. 5 includes a pair of A1 and A2 operational amplifiers 34 and 36. As shown, the voltage appearing across resistor 32 at circuit nodes 35 and 37 is fed back to the − and + inputs on signal leads B and A, respectively.

A1 operational amplifier 34 amplifies the voltage across the resistor 32 to provide an output voltage proportional to supply current (0.5v/amp). A2 operational amplifier 36 sets the loop gain and provides a means to adjust the value of emitter current to Iset, which limits the power output of the bipolar transistor amplifier 10 to a saturated level. Differential amplification is achieved in operational A1 amplifier 34 by using a reference applied to the + terminal through resistors 38 and 40, and by the signal applied to the negative terminal through resistor 44 with a feedback from the output applied through resistor 42. The signal is further amplified and inverted in A2 operational amplifier 36 with feedback control loop gain set by input resistor 30 and feedback resistor 50. An adjustable voltage offset is added to this signal through potentiometer 52, which provides a means to adjust the current set point. A zener diode 48 in the feedback limits the output of the A2 amplifier 36 to a voltage that insures that the control MOSFET 28 is clamped to a value no greater than its nominal "on" gate-source voltage.

The circuit as shown in FIG. 5 initially biases the gate of the MOSFET 28 fully "on" at a voltage level of +12 volts. As an RF input signal is applied to the bipolar amplifier transistor 10 by way of the coupling capacitor 12, emitter current flows through the MOSFET 28 and the current is monitored by means of the resistor 32 which has a relatively low value, e.g. 10 milli-ohms. When the current reaches the reference level 54 as shown in FIG. 6, the voltage applied to the gate of the MOSFET 28 starts to decrease. The ohmic resistance of MOSFET 28 then rises to a level sufficient to reduce the gain of the amplifier while keeping the output power substantially constant, as shown by the dashed line of FIG. 2.

Referring now to FIG. 7, as noted above, the passive embodiment of the invention consists in placing a high current, low voltage semiconductive device having a non-linear current voltage characteristic such as shown in FIG. 4 to emitter RF choke 14. A depletion mode MOSFET or JFET comprises a desired type device. Having its gate connected to the drain causes the device to operate as a constant current diode. However, most commercially available constant current diodes have a high saturation voltage and a high breakdown voltage and are sized for low current applications. A low voltage-high current structure, however, can be fabricated to provide the desired transfer characteristics. In such an arrangement, it would be designed so that the drain voltage would never exceed a few volts. The gate oxide of such a device would be made extremely thin, lowering the threshold voltage while keeping the saturation voltage very low in the range of 0.2 volts required, as shown, for example, in FIG. 4. The die would be constructed so that each cell would saturate at a nominal current. Any size device could then be devised simply by parallel connecting multiple cells.

Figure 8A:
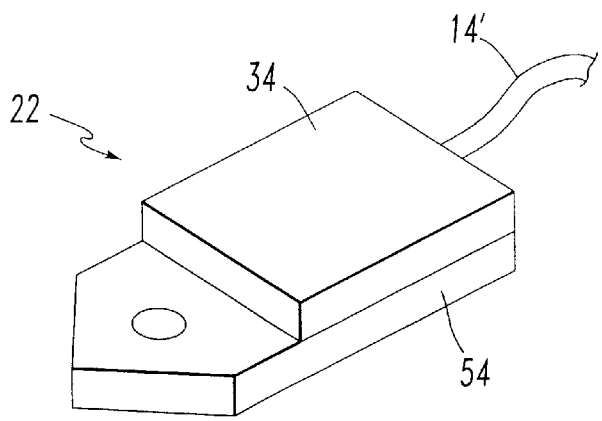
FIGS. 8A and 8B are perspective views of two possible package configurations for the FET circuit element shown in FIG. 7.
Figure 8B:
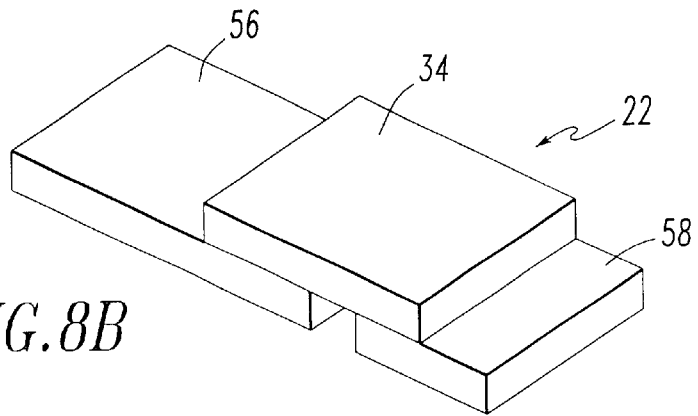

FIGS. 8A and 8B disclose two possible package configurations to simplify module assembly of the MOSFET device 34 shown in FIG. 7. The device shown in FIG. 8A, in addition to including a mounting base 54, also includes an RF choke lead 14'. With respect to the package shown in FIG. 8B, it includes a pair of surface mount elements 56 and 58.

Thus, what has been shown and described is a Class C bipolar amplifier where the requirements of saturated power could be dropped from the test specification, thereby increasing yields and reducing costs. Furthermore, the need to run concurrent overdrive and VSWR survivability tests could be eliminated. Or if such tests were conducted, the stress on the transistor would be greatly reduced, again increasing yield and reducing cost. An easier module design would also result with elimination of complex amplitude control circuits. Also, minimum real estate penalty on the module could be achieved, particularly with respect to the configuration shown in FIG. 7, where a simple two terminal device is utilized.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method of limiting the output power of an RF Class C bipolar transistor amplifier, comprising the steps of:

(a) configuring the amplifier so as to have a common base transistor configuration where an input signal is applied to an emitter electrode and an output signal is provided at a collector electrode; and (b) connecting circuit means including a semiconductor device having a non-linear high current, low voltage current-voltage transfer characteristic, connected in series with an RF choke connected to the emitter electrode and causing power saturation at a predetermined level in response to a specified power input level, wherein the circuit means also includes a feedback control circuit responsive to emitter current resulting from an RF input signal being sensed by a low ohmic valued resistor, equal to or less than about 15 milli-ohms, connected in series with the RF choke and the semiconductor device for controlling the semiconductor device.

2. A method according to claim 1 wherein the semiconductor device comprises a field effect transistor.

3. A method according to claim 2 wherein the field effect transistor comprises a MOSFET.

4. A method of limiting the output power of an RF Class C bipolar transistor amplifier, comprising the steps of:

(a) configuring the amplifier so as to have a common base transistor configuration where an input signal is applied to an emitter electrode and an output signal is provided at a collector electrode; and (b) connecting circuit means including a semiconductor device having a non-linear high current, low knee voltage current-voltage transfer characteristic connected in series with an RF choke connected to the emitter electrode and causing power saturation at a predetermined level in response to a specified power input level;

wherein the semiconductor device comprises a transistor having a gate electrode electrically directly connected to a drain electrode so as to operate as a constant current semiconductor diode.

5. A method according to claim 4 wherein the semiconductor device comprises a depletion mode field effect transistor.

6. A method according to claim 5 wherein the field effect transistor comprises a MOSFET or JFET.

7. An RF signal amplifier having output power saturation control, comprising:

an amplifier circuit operating in a class C mode of operation and including a first semiconductor device having input and output power terminals and a power control terminal; and, circuit means including a second semiconductor device having a non-linear current-voltage transfer characteristic connected in series with an RF choke and one of the terminals of the first semiconductor device for causing power saturation of an output of the amplifier circuit in response to a specified power input, wherein the circuit means also includes a feedback control circuit responsive to emitter current resulting from an RF input signal being sensed by a low ohmic valued resistor, equal to or less than about 15 milli-ohms, connected in series with the RF choke and the second semiconductor device for controlling the second semiconductor device.

8. An RF signal amplifier according to claim 7 wherein said first semiconductor device comprises a transistor.

9. An RF signal amplifier according to claim 8 wherein said transistor comprises a bipolar transistor, where the input and output power terminals respectively comprise emitter and collector terminals and the power control terminal comprises a base terminal, and wherein said transistor is connected in a common base circuit configuration, where the power input terminal comprises the emitter terminal and the power output terminal comprises the collector terminal, and wherein said circuit means has a non-linear high current-low knee voltage transfer characteristic and is coupled to the remitter terminal.

10. An RF signal amplifier according to claim 9 wherein the RF choke coil is connected to said emitter terminal of the bipolar transistor.

11. An RF signal amplifier according to claim 7 wherein the second semiconductor device comprises a field effect transistor.

12. An RF signal amplifier according to claim 11 wherein the field effect transistor comprises a MOSFET or JFET.

13. An RF signal amplifier having output power saturation control, comprising:

an amplifier circuit operating in a class C mode of operation including a semiconductor device having input and output power terminals and a power control terminal; and, circuit means having a non-linear high current, low knee voltage current-voltage transfer characteristic connected to one of the terminals of the semiconductor device for causing power saturation of an output of the amplifier circuit in response to a specified power input, and wherein said circuit means comprises a constant current semiconductor diode.

14. An RF signal amplifier according to claim 13 wherein the constant current semiconductor diode comprises a depletion mode field effect transistor having a gate electrode directly connected to a drain electrode.

15. An RF signal amplifier having output power saturation control, comprising:

an amplifier circuit operating in a class C mode of operation including a semiconductor device having input and output power terminals and a power control terminal; and, circuit means including a depletion mode field transistor, having a gate electrode electrically connected directly to a drain electrode, having a non-linear current-voltage transfer characteristic and being connected to one of the terminals of the semiconductor device for causing power saturation of an output of the amplifier circuit in response to a specified power input.

16. An RF signal amplifier according to claim 15 wherein the field effect transistor comprises a MOSFET or JFET.

* * * * *